United States Patent
Lochtefeld

(10) Patent No.: US 8,309,986 B2
(45) Date of Patent: Nov. 13, 2012

(54) TRI-GATE FIELD-EFFECT TRANSISTORS FORMED BY ASPECT RATIO TRAPPING

(75) Inventor: Anthony J. Lochtefeld, Ipswich, MA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/107,483

(22) Filed: May 13, 2011

(65) Prior Publication Data
US 2011/0210374 A1   Sep. 1, 2011

Related U.S. Application Data

(60) Continuation of application No. 12/856,402, filed on Aug. 13, 2010, now Pat. No. 7,977,706, which is a division of application No. 11/861,931, filed on Sep. 26, 2007, now Pat. No. 7,799,592.

(60) Provisional application No. 60/847,424, filed on Sep. 27, 2006.

(51) Int. Cl.
*H01L 21/02* (2006.01)

(52) U.S. Cl. ......... 257/190; 257/E21.092; 257/E21.097; 257/E21.102; 257/E21.133; 257/E21.403; 257/E21.562; 257/E29.246; 257/E29.296; 257/E29.298; 257/E33.05; 438/44; 438/238; 438/481

(58) Field of Classification Search .................. None
See application file for complete search history.

(56) References Cited

U.S. PATENT DOCUMENTS

| | | | | |
|---|---|---|---|---|
| 2002/0084000 A1* | 7/2002 | Fitzgerald | ............ | 148/33.2 |
| 2005/0073028 A1* | 4/2005 | Grant et al. | ............ | 257/617 |
| 2005/0250285 A1* | 11/2005 | Yoon et al. | ............ | 438/283 |

FOREIGN PATENT DOCUMENTS

JP   02062090   * 2/1999

* cited by examiner

*Primary Examiner* — Charles Garber
*Assistant Examiner* — Yasser Abdelaziez
(74) *Attorney, Agent, or Firm* — Slater & Matsil, L.L.P.

(57) ABSTRACT

Semiconductor structures include a trench formed proximate a substrate including a first semiconductor material. A crystalline material including a second semiconductor material lattice mismatched to the first semiconductor material is formed in the trench. Process embodiments include removing a portion of the dielectric layer to expose a side portion of the crystalline material and defining a gate thereover. Defects are reduced by using an aspect ratio trapping approach.

14 Claims, 5 Drawing Sheets

TRI-GATE FIELD-EFFECT TRANSISTORS FORMED BY ASPECT RATIO TRAPPING

RELATED APPLICATION

This application is a continuation of and claims the benefit of U.S. patent application Ser. No. 12/856,402, filed on Aug. 13, 2010, entitled "Tri-Gate Field-Effect Transistors Formed by Aspect Ratio Trapping," which is a divisional of and claims the benefit of U.S. patent application Ser. No. 11/861,931, filed on Sep. 26, 2007, entitled "Tri-Gate Field-Effect Transistors Formed by Aspect Ratio Trapping," which claims the benefit of and priority to U.S. Provisional Application Ser. No. 60/847,424 filed Sep. 27, 2006; the entire disclosures of these applications are hereby incorporated by reference in their entireties.

FIELD OF THE INVENTION

This invention relates generally to semiconductor processing and particularly to the formation of tri-gate field-effect transistors.

BACKGROUND

Due to the increasing difficulty in shrinking complementary metal-oxide-semiconductor (CMOS) transistor gate lengths while simultaneously controlling leakage current, the traditional single-gate metal-oxide-semiconductor field-effect transistor (MOSFET) structure (where the inversion layer is formed only in the plane of the wafer surface) may be supplanted by dual- or triple-gate MOSFET structures. These structures, by increasing the gate's control of the channel potential, allow greater ability to turn off MOSFETs with ultra-short channel lengths. Of the various multi-gate MOSFETs structures explored in recent years, the most promising in terms of manufacturability and performance are typically variations of the so-called "FinFET" structure; these variations are known by such terms as "Tri-gate," "Omega-FET," or "MuGFET." Generally, for each of these device types, a strip or "fin" of silicon (Si) is formed; subsequently the gate material is deposited and etched, so that the resulting gate surrounds the fin on the three exposed sides. The channel region of the device is located in the fin. To introduce strain into such a strip or fin, researchers have explored process-inducement methods similar to those employed in single-gate MOSFETs, such as, for example, epitaxially raised silicon germanium (SiGe) or silicon carbide (SiC) source and drain regions. There are, however, limitations to such methods, including limitations on how much strain can be introduced into the channel.

SUMMARY

In various embodiments, the invention includes methods and structures for introducing strain into FinFET-type devices by exploiting differences in natural lattice constants between the channel region in the fin and a substantially relaxed semiconductor region below the channel.

Accordingly, an aspect of the invention features a method for forming a structure. The method includes forming a dielectric layer over a semiconductor substrate comprising a first semiconductor material. A trench is defined in the dielectric layer, extending to a surface of the substrate, and having a height h and a width w; the ratio of h to w is preferably $\geq 0.5$. A crystalline material is formed in the trench. The crystalline material includes (i) a first layer comprising a second semiconductor material, and (ii) a second layer comprising a third semiconductor material. A majority of dislocation defects in the crystalline material terminate within the trench. A portion of the dielectric layer is removed to expose a side portion of the crystalline material, and a gate is defined over the crystalline material.

One or more of the following features may be included. The second and third semiconductor materials may have different lattice constants; the difference between lattice constants may be less than 1%. The second semiconductor material may be relaxed and the third semiconductor material may be strained. Removing a portion of the dielectric layer may include exposing at least a portion of a sidewall of the second layer. The second semiconductor material may include SiGe, and/or the third semiconductor material may include at least one of Si and Ge.

The second semiconductor material may have a bandgap of at least 0.5 eV. It may include at least one of a III-V compound, such as aluminum antimonide (AlSb), indium aluminum antimonide (InAlSb), gallium antimonide (GaSb), or a II-VI compound, such as cadmium selenide (CdSe), zinc telluride (ZnTe), or cadmium telluride (CdTe).

The third semiconductor material may have a bulk electron mobility greater than 2000 $cm^2/V \cdot s$ and may include at least one of indium antimonide (InSb), indium arsenide (InAs), or indium gallium arsenide (InGaAs).

In another aspect, the invention features a method for forming a structure, in which a dielectric layer is formed over a semiconductor substrate including a first semiconductor material. A trench is defined in the dielectric layer, extending to a surface of the substrate, and having a height h and a width w; the ratio of h to w is preferably $\geq 0.5$. At least one crystalline material layer including a second semiconductor material having a lattice mismatch with the first semiconductor material is formed in the trench, such that a majority of dislocation defects in the second semiconductor material terminate within the trench. A portion of the dielectric layer is removed to expose a side portion of the crystalline material, and a gate is defined over the crystalline material.

One or more of the following features may be included. The second semiconductor material may include at least one of a III-V compound or a II-VI compound. The second semiconductor material may have a bandgap of at least 0.5 eV and/or have a bulk electron mobility greater than 2000 $cm^2/V \cdot s$.

The crystalline material layer(s) may include a first layer comprising the second semiconductor material and a second layer comprising a third semiconductor material. The third semiconductor material may include at least one of a III-V compound or a II-VI compound, and the third semiconductor material may be different from the second semiconductor material. The second and third semiconductor materials may have different lattice constants. The second semiconductor material may be relaxed and the third semiconductor material may be strained. The third semiconductor material may include at least one element contained in the second semiconductor material. Defining the dielectric layer may include thermal oxidation and/or plasma-enhanced chemical vapor deposition (PECVD).

In yet another aspect, the invention features a method for forming a structure, including removing a portion of a semiconductor substrate comprising a first semiconductor material to define a fin. A dielectric layer is deposited over the substrate and the fin, and then planarized such that a top surface of the dielectric layer is substantially co-planar with a top surface of the fin. A trench is formed by removing at least a portion of the fin, the trench has a height h and a width w, and the ratio of h to w is preferably $\geqq 0.5$. A crystalline material is formed in the trench, and includes a second semiconductor material lattice-mismatched to the first semiconductor material. A majority of dislocation defects in the crystalline material terminate within the trench. A portion of the dielectric layer is removed to expose a side portion of the crystalline material, and a gate is defined over the second semiconductor material.

In still another aspect, the invention features a structure having a strained channel and including multiple semiconductor material layers at least partially disposed in a trench. The structure includes a dielectric layer disposed over a semiconductor substrate comprising a first semiconductor material. A trench is disposed in the dielectric layer. The trench (i) extends to a surface of the substrate, (ii) is defined by at least one sidewall having a height h at least equal to a predetermined distance H from the surface of the substrate, and (iii) has a width w. A crystalline material is at least partially disposed in the trench. The crystalline material includes a first layer comprising a second semiconductor material and a second layer comprising a third semiconductor material. A side portion of the crystalline material extends above the dielectric layer, and a gate is disposed over the crystalline material. The ratio of the height h to the width w is $\geqq 0.5$, and a majority of dislocation defects in the crystalline material terminate at or below the predetermined vertical distance H (with $h \geqq H$). The third semiconductor material defines a strained channel.

In another aspect, a semiconductor device includes a transistor structure formed above a defect trapping region. The semiconductor device includes a defect-trapping region comprising a trench including a dielectric sidewall. The defect-trapping region is proximate a substrate having a first lattice constant. A semiconductor material, disposed within the defect trapping region, has a second lattice constant different from the first lattice constant. A majority of crystalline defects in the semiconductor material terminate within the defect trapping region. A fin having a semiconducting sidewall is disposed above the semiconductor material disposed within the defect trapping region, and a transistor gate is disposed over the semiconducting sidewall and top surface of the fin.

Still another aspect of the invention features a method for forming a structure. The method includes the steps of forming a dielectric layer over a semiconductor substrate that itself includes a first semiconductor material, and defining a trench in the dielectric layer extending to a surface of the substrate. The trench is defined by at least one sidewall having a height h at least equal to a predetermined distance H from the surface of the substrate; the trench is substantially rectangular and has a width w. A crystalline material including a first layer and a second layer is formed in the trench. The first layer includes a second semiconductor material, and the second layer includes a third semiconductor material. A portion of the dielectric layer is removed to expose a side portion of the crystalline material, and a gate is defined over the crystalline material. The ratio of the height h of the trench to the width w of the trench is $\geqq 0.5$, e.g., $\geqq 1$, and dislocation defects in the crystalline material terminate at the sidewall of the trench at or below the predetermined distance H ($h \geqq H$).

The second and third semiconductor materials may have different lattice constants. The second semiconductor material may be relaxed and the third semiconductor material may be strained. Removing a portion of the dielectric layer may include exposing at least a portion of a sidewall of the second layer. The second semiconductor material may comprise SiGe, and the third semiconductor material may include at least one of Si and Ge.

The second semiconductor material may have a bandgap of at least 0.5 eV. The second semiconductor material may include at least one of a III-V material and a II-VI material, e.g., at least one of AlSb, InAlSb, GaSb, CdSe, ZnTe, and CdTe.

The third semiconductor material may have a bulk electron mobility greater than 2000 $cm^2/V \cdot s$. The third semiconductor material may include at least one of InSb, InAs, and InGaAs. The difference between a lattice constant of the second semiconductor material and a lattice constant of the third semiconductor material may be less than 1%.

In another aspect, the invention features a method for forming a structure. The method includes removing a portion of a semiconductor substrate including a first semiconductor material to define a fin, and depositing a dielectric layer over the substrate and the fin. The dielectric layer is planarized such that a top surface of the dielectric layer is substantially co-planar with a top surface of the fin. A trench is defined by removing at least a portion of the fin. The trench has at least one sidewall having a height h at least equal to a predetermined distance H from the bottom of the trench. The trench is substantially rectangular and has a width w. A crystalline material including a second semiconductor material is formed in the trench. A portion of the dielectric layer is removed to expose a side portion of the crystalline material, and a gate is defined over the second semiconductor material. The ratio of the height h of the trench to the width w of the trench is $\geqq 0.5$, e.g., $\geqq 1$, and dislocation defects in the crystalline material terminate at the sidewall of the trench at or below the predetermined distance H, and $h \geqq H$.

In another aspect, the invention features a structure including a dielectric layer disposed over a semiconductor substrate that itself includes a first semiconductor material. A trench is disposed in the dielectric layer and extends to a surface of the substrate. The trench is defined by at least one sidewall having a height h at least equal to a predetermined distance H from the surface of the substrate. The trench is substantially rectangular and has a width w. A crystalline material is at least partially disposed in the trench. The crystalline material comprises a first layer including a second semiconductor material and a second layer including a third semiconductor material. A side portion of the second layer extends above the dielectric layer, and a gate is disposed over the crystalline material. The ratio of the height h of the trench to the width w of the trench is $\geqq 0.5$, e.g., $\geqq 1$, dislocation defects in the crystalline material terminate at the sidewall of the trench at or below the predetermined distance H, $h \geqq H$, and the third semiconductor material defines a strained channel.

The second and third semiconductor materials may have different lattice constants. The second semiconductor material may be relaxed and the third semiconductor material may be strained. In some embodiments, the second semiconductor material may include SiGe and the third semiconductor material may include at least one of Si and Ge.

In another aspect, the invention features a structure including a dielectric layer disposed over a semiconductor substrate that itself includes a first semiconductor material. A trench is disposed in the dielectric layer and extends to a surface of the substrate. The trench is defined by at least one sidewall having a height h at least equal to a predetermined distance H from the surface of the substrate. The trench is substantially rectangular and has a width w. A crystalline material is at least partially disposed in the trench. The crystalline material comprises a first layer including a second semiconductor layer and a second layer including a third semiconductor material. A side portion of the second layer extends above the dielectric layer, and a gate is disposed over the crystalline material. The ratio of the height h of the trench to the width w of the trench is $\geq 0.5$, e.g., $\geq 1$, dislocation defects in the crystalline material terminate at the sidewall of the trench at or below the predetermined distance H, $h \geq H$, and the second semiconductor material has a bandgap of at least 0.5 eV.

The second semiconductor material may include at least one of a III-V material and a II-VI material, e.g., at least one of AlSb, InAlSb, GaSb, CdSe, ZnTe, or CdTe. The third semiconductor material may have a bulk electron mobility greater than 2000 cm$^2$/V·s, and may include, e.g., at least one of InSb, InAs, and InGaAs. The difference between a lattice constant of the second semiconductor material and a lattice constant of the third semiconductor material may be less than 1%.

BRIEF DESCRIPTION OF FIGURES

In the drawings, like reference characters generally refer to the same features throughout the different views. Also, the drawings are not necessarily to scale, emphasis instead being placed upon illustrating the principles of the invention.

DETAILED DESCRIPTION

Figure 1:
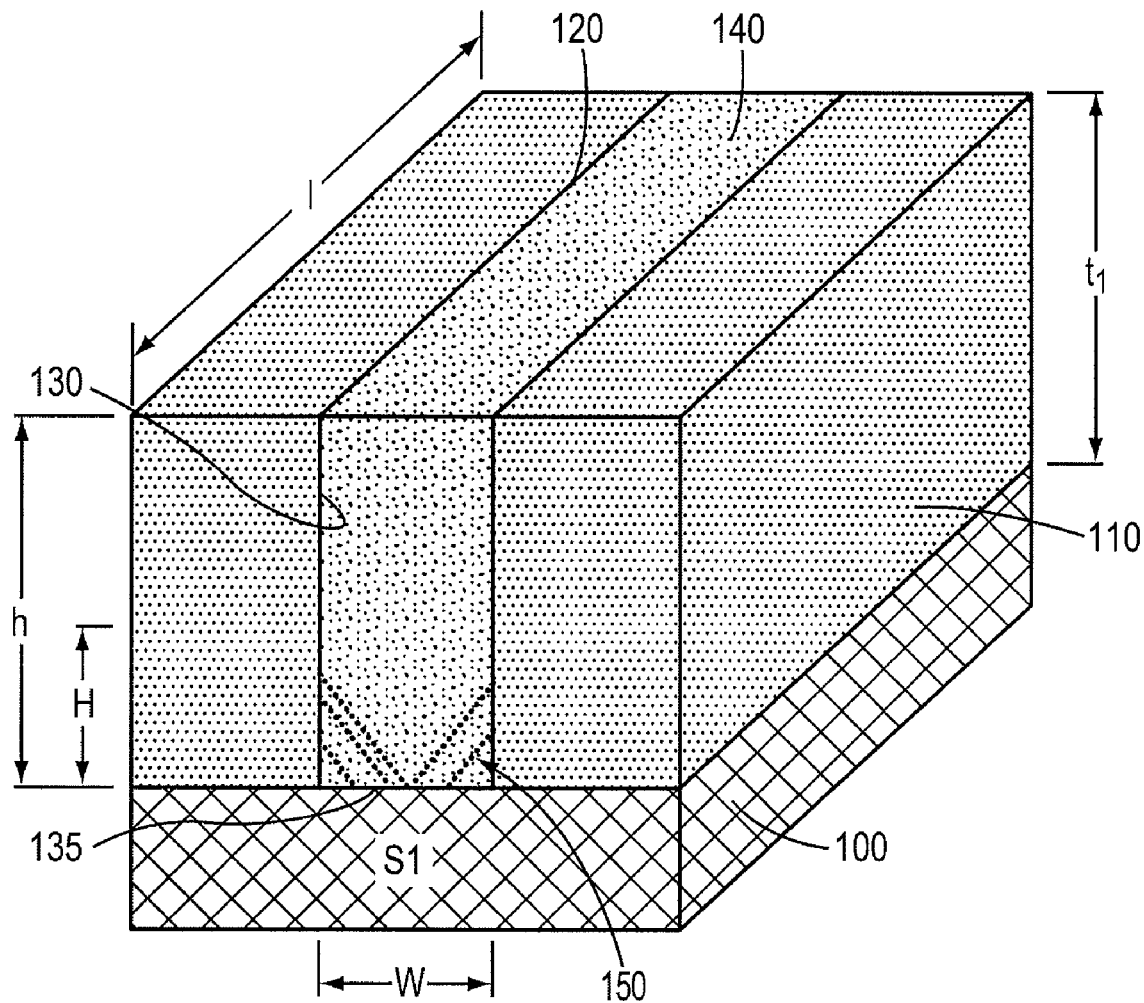
FIGS. 1-2 are schematic perspective views illustrating a method for formation of a device on a semiconductor substrate in accordance with an aspect of the invention.

Referring to FIG. 1, a substrate 100 includes a first semiconductor material S1. The substrate 100 may be, for example, a bulk Si wafer, a bulk germanium (Ge) wafer, a semiconductor-on-insulator (SOI) substrate, or a strained semiconductor-on-insulator (SSOI) substrate. The substrate 100 may include or consist essentially of the first semiconductor material, such as a group IV element, e.g., Ge or Si, a III-V compound, or a II-VI compound. In an embodiment, substrate 100 includes or consists essentially of (100) Si.

A dielectric layer 110 is formed over the semiconductor substrate 100. The dielectric layer 110 may include or consist essentially of a dielectric material, such as silicon nitride (Si$_3$N$_4$) or silicon dioxide (SiO$_2$). The dielectric layer 110 may be formed by any suitable technique, e.g., thermal oxidation or PECVD. As discussed below, the dielectric layer may have a thickness $t_1$ corresponding to a desired height h of crystalline material to be deposited in a trench formed through the dielectric layer. In some embodiments, the thickness $t_1$ of the dielectric layer 110 may be in the range of, e.g., 25-1000 nm.

A mask (not shown), such as a photoresist mask, is formed over the substrate 100 and the dielectric layer 110. The mask is patterned to expose at least a portion of the dielectric layer 110. The exposed portion of the dielectric layer 110 is removed by, e.g., reactive ion etching (RIE) to define a defect trapping region, e.g., trench 120. Trench 120 extends to a surface of the substrate 100 and may be defined by at least one sidewall 130. The height h of the sidewall 130 corresponds to the thickness $t_1$ of the dielectric layer 110, and may be at least equal to a predetermined vertical distance H from a top surface 135 of the substrate, calculated as described below.

It has been observed experimentally that dislocations in a mismatched cubic semiconductor grown on a Si (100) surface in the near vicinity (e.g., within approximately 500 nm or less) of a vertical dielectric sidewall surface bend toward that surface at approximately 30 degrees through 60 degrees. For example, the dislocations may bend toward that surface at approximately a 45-degree angle to that surface. Based on this relationship, the predetermined vertical distance H necessary to trap defects is, typically, approximately equal to a width between ½ w and 2 w, where w is the width of the trench. This range is based on the range of intersection angles of approximately 30 degrees through 60 degrees; then, $\tan(30°)w \leq H \leq \tan(60°)w$, which roughly corresponds to ½ $w \leq H \leq 2w$.

The trench may be substantially rectangular in terms of cross-sectional profile, a top view, or both, and have a width w that is smaller than a length l of the trench. For example, the width w of the trench may be less than about 500 nm, e.g., about 10-100 nm, and the length l of the trench may exceed each of w and H. The ratio of the height h of the trench to the width w of the trench 120 may be $\geq 0.5$, e.g., $\geq 1$.

A crystalline material 140 is formed in the trench 120. The crystalline material 140 may include or consist essentially of a group IV element or compound, a III-V compound, or a II-VI compound. Examples of suitable group IV elements or compounds include Ge, Si, SiGe, and SiC. Examples of suitable 111-V compounds include gallium arsenide (GaAs), gallium nitride (GaN), InAs, InSb, InAlSb, AlSb, indium aluminum arsenide (InAlAs), indium phosphide (InP), and InGaAs. Examples of suitable II-VI compounds include CdSe, ZnTe, and CdTe.

The crystalline material 140 may be formed by selective epitaxial growth in any suitable epitaxial deposition system, including, but not limited to, metal-organic chemical vapor deposition (MOCVD), atmospheric-pressure CVD (APCVD), low- (or reduced-) pressure CVD (LPCVD), ultra-high-vacuum CVD (UHCVD), molecular beam epitaxy (MBE), or atomic layer deposition (ALD). In the CVD process, selective epitaxial growth typically includes introducing a source gas into the chamber. The source gas may include at least one precursor gas and a carrier gas, such as, for example, hydrogen. The reactor chamber may be heated by, for example, RF-heating. The growth temperature in the chamber may range from about 300° C. to about 900° C., depending on the composition of the crystalline material. The growth system may also utilize low-energy plasma to enhance the layer growth kinetics.

The epitaxial growth system may be a single-wafer or multiple-wafer batch reactor. Suitable CVD systems commonly used for volume epitaxy in manufacturing applications include, for example, an Aixtron 2600 multi-wafer system available from Aixtron, based in Aachen, Germany; an EPI CENTURA single-wafer multi-chamber systems available from Applied Materials of Santa Clara, Calif.; or an EPSILON single-wafer epitaxial reactor available from ASM International based in Bilthoven, The Netherlands.

Dislocation defects 150 in the crystalline material 140 reach and terminate at the sidewalls of the trench 120 in the dielectric material 110 at or below the predetermined vertical distance H from the surface 135 of the substrate, such that dislocations in the crystalline material 140 decrease in density with increasing distance from the bottom portion of the trench 120. Accordingly, the upper portion of the crystalline material is substantially exhausted of dislocation defects. Various dislocation defects such as threading dislocations, stacking faults, twin boundaries, or anti-phase boundaries may thus be substantially eliminated from the upper portion of the crystalline material.

A planarization step such as, e.g., CMP may be used to ensure that the top surface of the crystalline material 140 is substantially co-planar with the top surface of the dielectric material 110.

Figure 2:
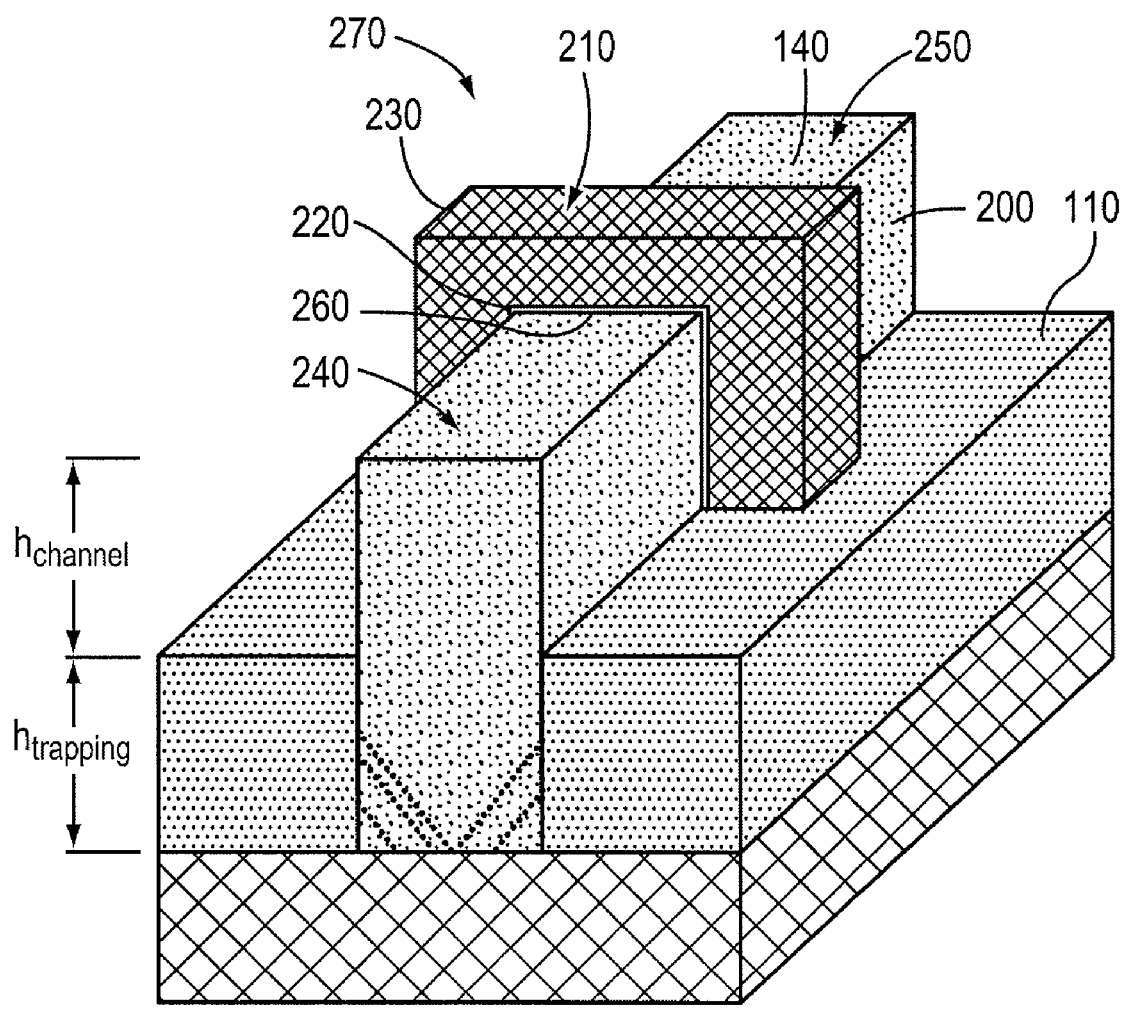

Referring to FIG. 2, a portion of the dielectric layer 110 is selectively removed to expose a side portion 200 of the crystalline material 140. A height $h_{channel}$ of the exposed side portion 200 may be equivalent to the thickness of a channel region to be formed. Preferably, the portion of the dielectric layer 110 is removed by an isotropic etch, e.g., a wet etch employing, for example, HF. A dry etch may also be used, e.g., a plasma etch employing $CF_4$ and $H_2$.

The crystalline material 140 may be considered as having two portions: a lower portion for trapping dislocation defects and an upper portion for a channel portion of a tri-gate MOSFET incorporating the crystalline material 140. The height h of the crystalline material thus has two components: the height $h_{trapping}$ of the lower portion (where defects are concentrated) and the height $h_{channel}$ of the upper portion (which is largely free of defects). The height $h_{trapping}$ of the trapping portion may be selected from a range of about ½ w$\leq h_{trapping} \leq$2w, to ensure effective trapping of dislocation defects. The actual value of $h_{trapping}$ required may depend upon the type of dislocation defects encountered, which, in turn, may depend on the materials used, and also upon the orientation of the trench sidewalls. In some instances, the height $h_{trapping}$ need not be greater than that required for effective defect trapping, in order to ensure that the dislocation defects are trapped at a sufficient distance away from the channel portion. In this way, the deleterious effects of dislocation defects upon device performance are not experienced. For example, $h_{trapping}$ may be, e.g., 10-100 nm greater than required for effective trapping of defects. For the channel portion, the height $h_{channel}$ may typically be selected from the range of approximately ½ w$\leq h_{channel} \leq$10 w. In some cases, if $h_{channel}$ is significantly less than ½ w, the device may no longer be considered a multi-gate device, i.e., if conduction occurs primarily on the top surface of the gates disposed over the channel portion. If $h_{channel}$ is significantly greater than 10 w, subsequent device processing may be challenging, for example, because of possible mechanical instability of the fin during processing, or because of challenges in implanting ions in sidewalls of closely packed devices that include tall fins.

A gate 210 is defined over the crystalline material 140 by deposition and selective removal of a gate dielectric material 220 and a conductive gate material 230. The gate dielectric material may be, e.g., $SiO_2$, $Si_3N_4$, $HfO_2$, HfSiON, and/or HfSiO. The conductive gate material 230 may be, for example, polysilicon, amorphous Si, Ge, or SiGe gate material, or a metal or metal alloy. In a tri-gate device, gate 210 has three portions, one on each exposed side portion of the crystalline material 140 and one on a top surface of the crystalline material 140.

A source and a drain may be defined in source and drain regions 240, 250 of the crystalline material 140 proximate to the gate 210 and next to a channel 260 disposed under the gate 210. The resulting structure is a tri-gate MOSFET 270, employing the benefits of aspect ratio trapping ("ART"). As used herein, "ART" refers generally to the technique(s) of causing defects in a material to terminate on a side surface as the material grows vertically, e.g., at a dielectric sidewall, with the sidewall being sufficiently high with respect to a width of the growth area, such that it traps most, if not all, of the defects.

Figure 4:
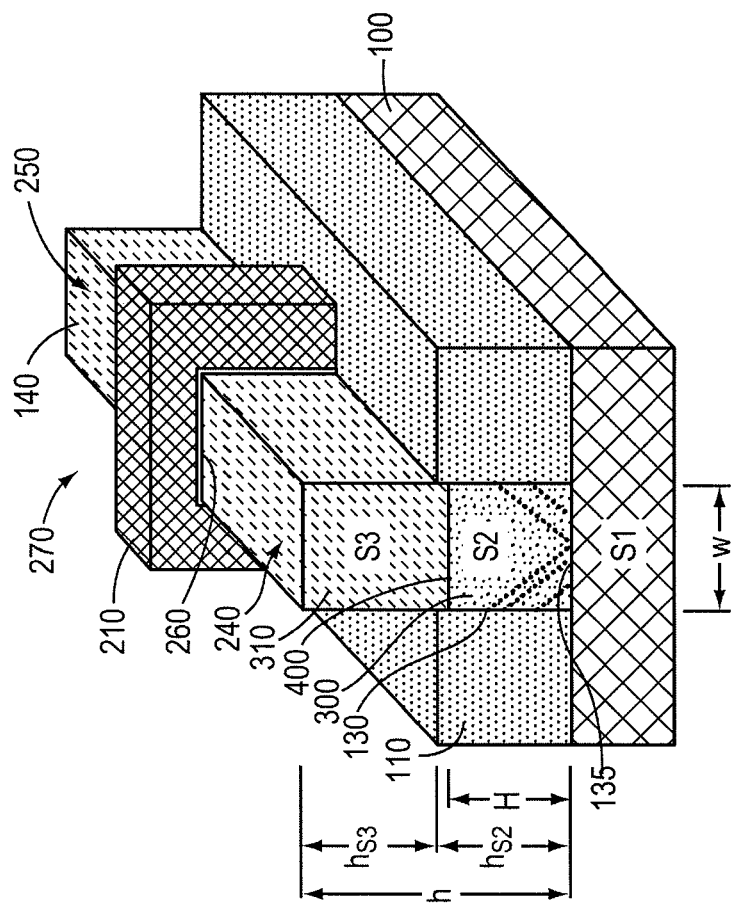
FIGS. 3-4 are schematic perspective views illustrating an alternative method for formation of a device on a semiconductor substrate in accordance with other aspects of the invention.
Figure 3:
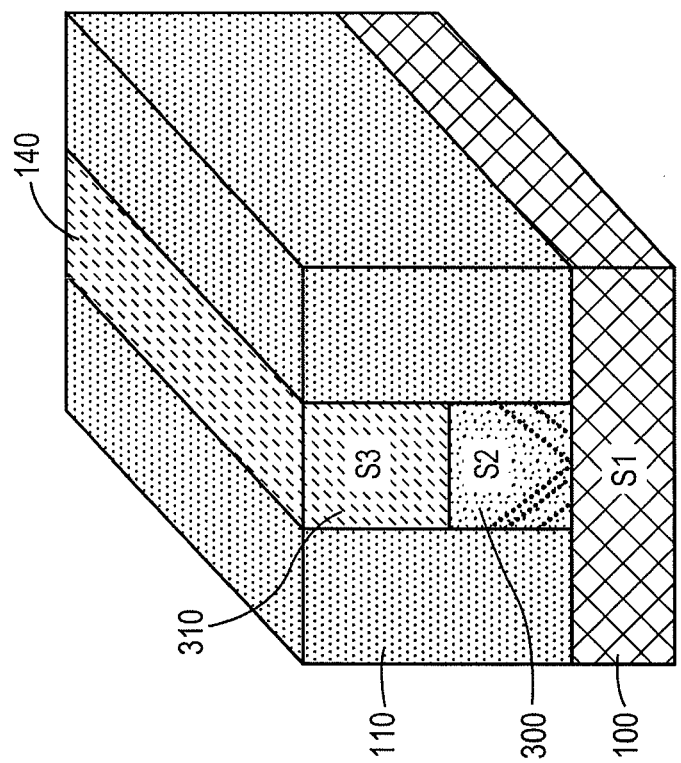

Referring to FIGS. 3 and 4, in some embodiments, the crystalline material 140 includes a first layer 300 and a second layer 310. The first layer 300 includes a second semiconductor material S2, and the second layer 310 includes a third semiconductor material S3. Each of the semiconductor material S2, S3 may include or consist essentially of one or more of a group IV element or compound, a III-V compound, or a II-VI compound. Examples of suitable group IV elements or compounds include Ge, SiGe, and SiC. Examples of suitable III-V compounds include GaAs, GaN, InAs, InSb, InAlSb, AlSb, InAlAs, InP, and InGaAs. Examples of suitable II-VI compounds include CdSe, ZnTe, and CdTe.

In an embodiment, the second and third semiconductor materials S2, S3 may be different materials having different lattice constants. The lattice mismatch may be selected from a range of, e.g., 0.2-4.0%. If the lattice mismatch is too low, the benefit to performance may not be significant. If the lattice mismatch is too high, the allowable thickness of the third semiconductor material S3 may be too limited, if gross relaxation of third semiconductor material S3 is to be avoided. The second semiconductor material S2 may be relaxed and the third semiconductor material S3 may be strained.

In one embodiment, the second semiconductor material S2 includes or consists essentially of relaxed SiGe, and the third semiconductor material S3 includes or consists essentially of Si. This combination results in tensile strain in the channel 260. The strain may be primarily uniaxial in the direction of current flow due to lateral elastic relaxation. This type of strain is particularly beneficial for n-type metal-oxide-semiconductor (NMOS) device performance.

In another embodiment, the second semiconductor material includes or consists essentially of relaxed SiGe, and the third semiconductor material S3 includes or consists essentially of Ge. This combination results in compressive strain in the channel 240. The strain may be primarily uniaxial in the direction of current flow due to lateral elastic relaxation. This type of strain is particularly beneficial for p-type metal-oxide-semiconductor (PMOS) device performance.

The resulting tri-gate MOSFET 270 or FinFET (FIG. 4) includes dielectric layer 110 disposed over the semiconductor substrate 100 including the first semiconductor material S1. Trench 120 is disposed in the dielectric layer 110, extends to the surface 135 of the substrate 100, and is defined by at least one sidewall 130. The sidewall 130 has a height h at least equal to a predetermined distance H from the surface of the substrate. The trench is substantially rectangular and has a width w. Crystalline material 140 is at least partially disposed in the trench. The crystalline material comprises a first layer 300 that includes a second semiconductor material, and a second layer 310 that includes a third semiconductor material. A side portion of the second layer extends above the dielectric layer. Gate 210 is disposed over the crystalline material. A ratio of the height h of the trench to the width w of the trench is preferably $\geq$0.5, dislocation defects in the crystalline material terminate at the sidewall of the trench at or below the predetermined distance H, h$\geq$H, and the third semiconductor material defines a strained channel 260.

A height $h_{s2}$ of the first layer 300 may be approximately equal to $h_{trapping}$, and a height $h_{s3}$ of the second layer 310 may be approximately equal to $h_{channel}$, with $h_{trapping}$ and $h_{channel}$ being determined as discussed above with reference to FIG. 2. The height of the first layer $h_{s2}$ and the height of the second layer $h_o$ may be selected so that the second semiconductor material S2 is relaxed and the third semiconductor material S3 is strained, or vice versa.

The following relationships may be taken into consideration when selecting $h_{s2}$ and $h_{s3}$. For compressively strained films, substantial relaxation occurs at a film thickness of approximately 3-4 times $h_c$, where $h_c$ is the critical thickness for the appearance of misfit dislocations. For tensilely strained films, substantial relaxation occurs at a film thickness of about $10h_c$.

Referring still to FIGS. 3 and 4, in another embodiment, the second and third semiconductor materials S2, S3 may be selected to allow the formation of a bi-layer tri-gate device with high-mobility channel material and suppressed junction leakage. For example, the second semiconductor material S2 may have a bandgap of at least 0.5 eV. The second semiconductor material S2 may include or consist essentially of a III-V material and/or a II-VI material, such as AlSb, InAlSb, GaSb, CdSe, ZnTe, and/or CdTe. The third semiconductor material S3 may have a high bulk electron mobility, e.g., greater than 2000 cm$^2$/V·s. Materials that are suitable for NMOS and have high mobilities include, e.g., InSb, InAs, and InGaAs.

For some potential III-V channel materials, straining the channel may not lead to significant performance benefits. In such cases, preferably the second semiconductor material S2 and the third semiconductor material S3 have similar lattice constants. Matching lattice constants helps avoid significant defect formation at an interface 400 between these two materials, while also allowing a sufficient height $h_{s3}$ (e.g., 20-200 nm) of the second layer 310 to make this layer suitable for use as a MOS channel. In a preferred embodiment, the difference between the lattice constant of the second semiconductor material and the lattice constant of the third semiconductor material is less than 1%.

In forming the tri-gate device 270, a source and a drain are defined in source and drain regions 240, 250, respectively. Preferably, bottom portions of the source and the drain are disposed in second semiconductor material S2, such that the relatively high bandgap of second semiconductor material S2 helps limit junction leakage.

Figure 6:
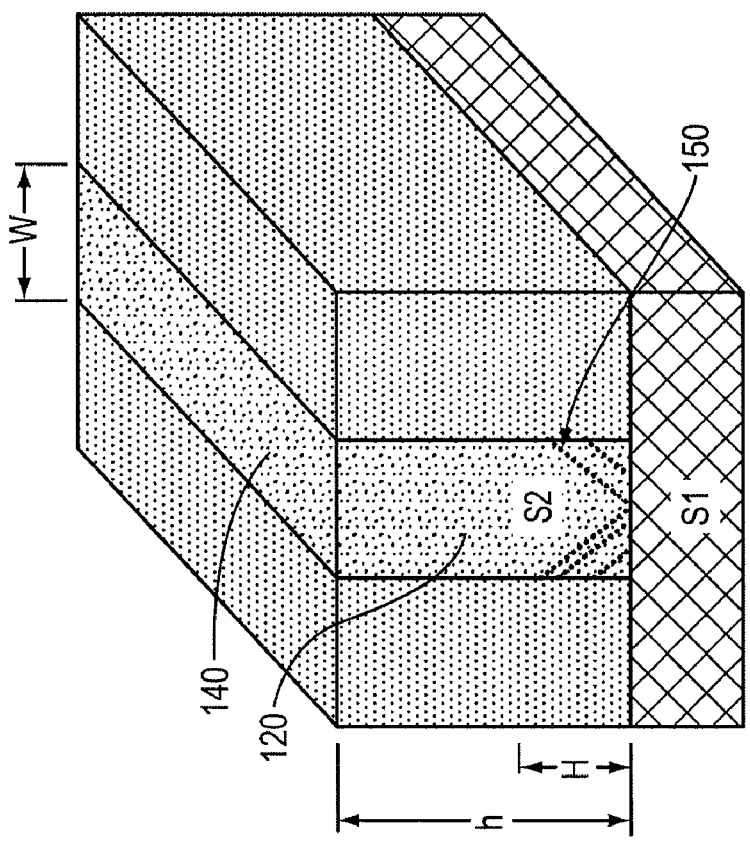
FIGS. 5-7 are schematic perspective views illustrating another alternative method for formation of a device on a semiconductor substrate in accordance with another aspect of the invention.
Figure 5:
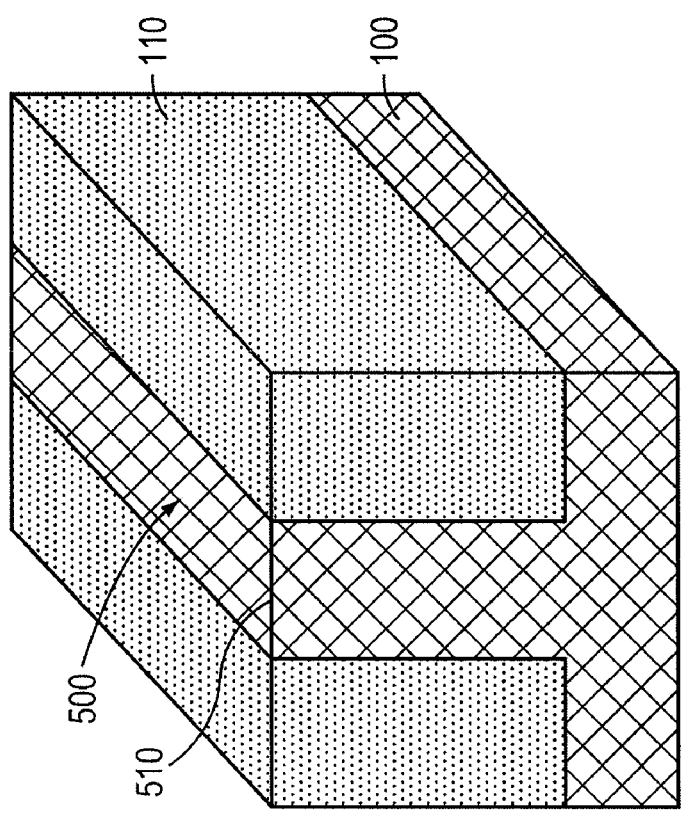
Figure 7:
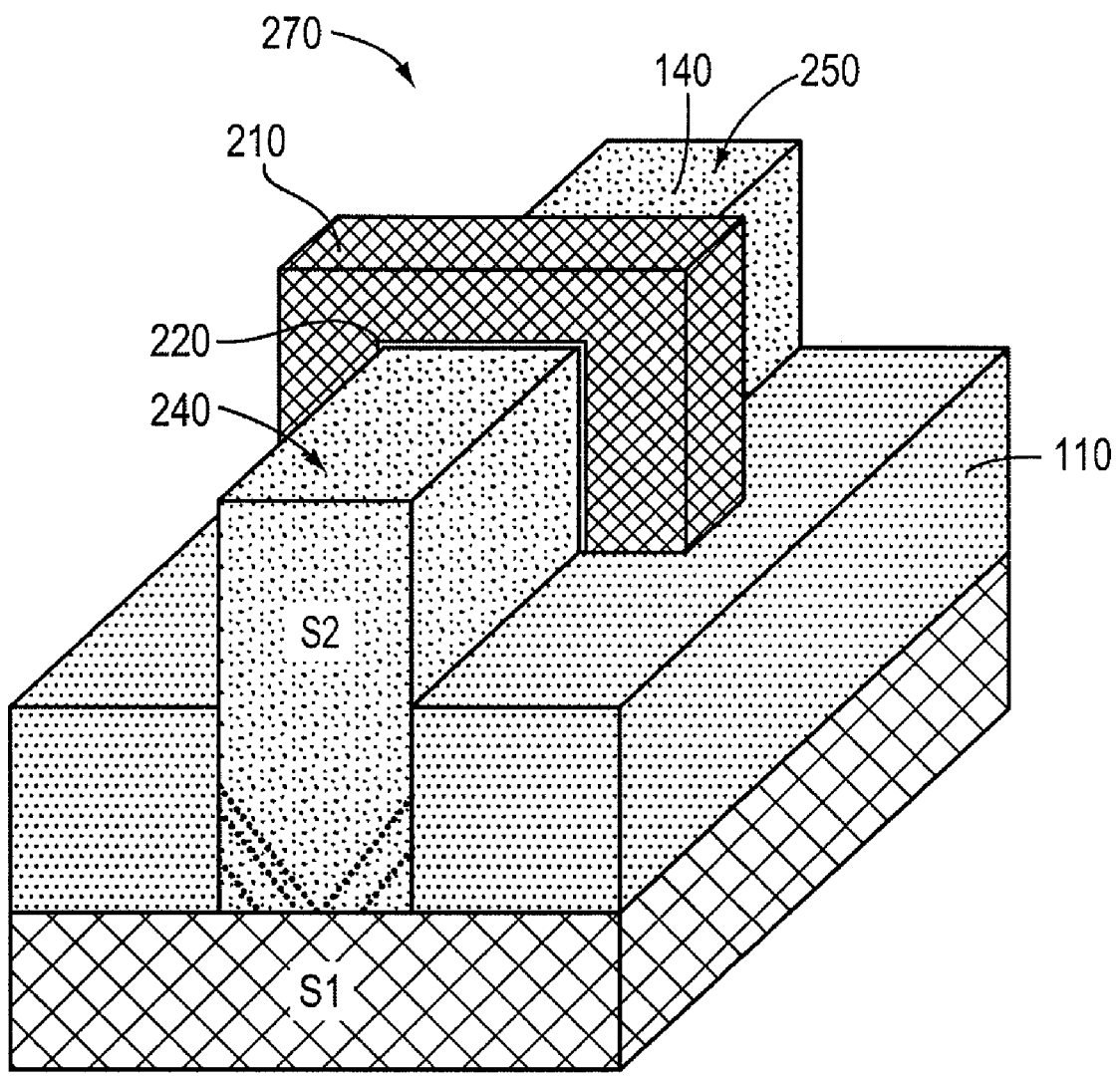

Referring to FIGS. 5-7, in some circumstances, from the standpoint of photolithography, it may be easier to define a narrow line than a narrow trench. Accordingly, an alternative process sequence for creating trench 120 begins with formation of a mask (not shown) over semiconductor substrate 100. A portion of the semiconductor substrate 100 is removed to define a fin 500. Fin 500 may have dimensions substantially identically to the dimensions of trench 120. Dielectric layer 110 is deposited over the semiconductor substrate 100 and the fin 500. The dielectric layer 110 is then planarized by, e.g., chemical-mechanical polishing (CMP) such that a top surface of the dielectric layer is substantially co-planar with a top surface 510 of the fin 500.

Trench 120 is defined by removing at least a portion of the fin 500. The fin may be selectively removed with a wet or dry etch that removes semiconductor material Si with respect to the dielectric layer 110. For example, if semiconductor material Si primarily comprises Si, and dielectric layer 110 primarily comprises SiO$_2$, a dry etch utilizing Cl$_2$ and/or HBr may be used to selectively remove the Si. The etch may be a timed etch, thereby avoiding undercutting a bottom portion of the dielectric layer 110.

As discussed above with respect to FIG. 1, trench 120 is defined by at least one sidewall having a height h at least equal to a predetermined distance H from the bottom of the trench. The trench may be substantially rectangular and have a width w. The ratio of the height h of the trench to the width w of the trench is preferably $\geq 1$, dislocation defects in the crystalline material terminate at the sidewall of the trench at or below the predetermined distance H, and $h \geq H$. A crystalline material 140 is formed in the trench. The crystalline material includes second semiconductor material S2.

Referring to FIG. 7, a portion of the dielectric layer 110 is removed to expose a side portion of the crystalline material. A gate dielectric 220 and a gate 210 are formed over the second semiconductor material S2, to define a FinFET.

The invention may be embodied in other specific forms without departing from the spirit or essential characteristics thereof. The foregoing embodiments are therefore to be considered in all respects illustrative rather than limiting on the invention described herein. Scope of the invention is thus indicated by the appended claims rather than by the foregoing description, and all changes which come within the meaning and range of equivalency of the claims are intended to be embraced therein.

What is claimed is:

1. A semiconductor structure comprising:
a semiconductor fin on a substrate, the substrate comprising a first crystalline semiconductor material, the semiconductor fin comprising a second crystalline semiconductor material, the second crystalline semiconductor material being lattice-mismatched to the first crystalline semiconductor material, the second crystalline semiconductor material adjoining the first crystalline semiconductor material at an interface, the interface having a rectangular area, the rectangular area having a width and a length, the length being greater than or equal to the width, the semiconductor fin comprising a sidewall extending from the interface to a height above the interface, the height being greater than half the width, and a majority of dislocation defects in the second crystalline semiconductor material terminate at or below the height; and
a gate on the sidewall of the semiconductor fin and on a top surface of the semiconductor fin.

2. The semiconductor structure of claim 1, wherein the length is greater than the height.

3. The semiconductor structure of claim 1, wherein the semiconductor fin comprises a third crystalline semiconductor material over the second crystalline semiconductor material.

4. The semiconductor structure of claim 3, wherein the third crystalline semiconductor material has a different composition from the second crystalline semiconductor material.

5. The semiconductor structure of claim 3, wherein the third crystalline semiconductor material is strained.

6. The semiconductor structure of claim 1 further comprising a first source/drain in the semiconductor fin and a second source/drain in the semiconductor fin and on an opposite side of the gate from the first source/drain.

7. The semiconductor structure of claim 1 further comprising a dielectric layer on the substrate, the dielectric having a trench in which the semiconductor fin is disposed.

8. The semiconductor structure of claim 7, wherein a dielectric sidewall of the dielectric layer is proximate the sidewall of the semiconductor fin.

9. The semiconductor structure of claim 7, wherein the dielectric layer has a dielectric height that extends to a point at or above a trapping height, the trapping height corresponding to a point at or below which the majority of dislocation defects in the second crystalline semiconductor material terminate.

10. A method for forming a semiconductor structure, the method comprising:
  epitaxially growing a semiconductor fin on a semiconductor substrate, the semiconductor substrate comprising a first crystalline semiconductor material, the semiconductor fin being at least partially disposed in a trench in a dielectric layer on the semiconductor substrate, the trench having a height and a width, the height being greater than or equal to half the width, the semiconductor fin comprising a second crystalline semiconductor material lattice-mismatched from the first crystalline semiconductor material, the second crystalline semiconductor material adjoining the first crystalline semiconductor material, a majority of dislocation defects in the second crystalline semiconductor material terminating within the trench;
  removing a portion of the dielectric layer to expose a sidewall of the semiconductor fin; and
  forming a gate on the sidewall of the semiconductor fin and over a top of the semiconductor fin.

11. The method of claim 10, wherein the semiconductor fin comprises a third crystalline semiconductor material over the second crystalline semiconductor material, the second crystalline semiconductor material and third crystalline semiconductor material having different lattice constants.

12. The method of claim 11, wherein the second crystalline semiconductor material is relaxed and the third crystalline semiconductor material is strained.

13. The method of claim 10, wherein the removing the portion of the dielectric layer does not remove the dielectric layer below a trapping height, the trapping height being a point at or below which the majority of dislocation defects in the second crystalline semiconductor material terminate.

14. The method of claim 10 further comprising forming a first source/drain in the semiconductor fin and a second source/drain in the semiconductor fin opposite the gate from the first source/drain.

* * * * *